(12) United States Patent
Tai et al.

(10) Patent No.: US 11,388,811 B1
(45) Date of Patent: Jul. 12, 2022

(54) HEAT-DISSIPATING SUBSTRATE STRUCTURE WITH BUILT-IN CONDUCTIVE CIRCUITS

(71) Applicant: AMULAIRE THERMAL TECHNOLOGY, INC., New Taipei (TW)

(72) Inventors: Shih-Hsi Tai, New Taipei (TW); Tze-Yang Yeh, New Taipei (TW)

(73) Assignee: AMULAIRE THERMAL TECHNOLOGY, INC., New Taipei (TW)

( * ) Notice: Subject to any disclaimer, the term of this patent is extended or adjusted under 35 U.S.C. 154(b) by 0 days.

(21) Appl. No.: 17/326,359

(22) Filed: May 21, 2021

(51) Int. Cl.
*H05K 1/02* (2006.01)

(52) U.S. Cl.
CPC ......... *H05K 1/0204* (2013.01); *H05K 1/0207* (2013.01); *H05K 1/0209* (2013.01); *H05K 2201/066* (2013.01); *H05K 2201/09281* (2013.01)

(58) Field of Classification Search
CPC .. H05K 1/0204; H05K 1/0207; H05K 1/0209; H05K 2201/66; H05K 2201/09281
See application file for complete search history.

(56) References Cited

U.S. PATENT DOCUMENTS

| 6,137,163 | A | 10/2000 | Kim et al. |
| 10,269,678 | B1 | 4/2019 | Viswanathan et al. |
| 2009/0121361 | A1 | 5/2009 | Masuda et al. |

FOREIGN PATENT DOCUMENTS

| CN | 1211821 A | 3/1999 |
| CN | 109841580 A | 6/2019 |
| TW | 201233258 A1 | 8/2012 |

*Primary Examiner* — Jeremy C Norris
(74) *Attorney, Agent, or Firm* — Li & Cai Intellectual Property Office

(57) ABSTRACT

A heat-dissipating substrate structure with built-in conductive circuits is provided. The heat-dissipating substrate structure includes an electrically insulating layer, a first metal layer, a second metal layer, and a heat-dissipating layer. The first metal layer and the second metal layer are disposed on the heat-dissipating layer at an interval. The electrically insulating layer encloses and is in contact with side walls of the first metal layer and side walls of the second metal layer, such that a top wall of the first metal layer and a top wall of the second metal layer are exposed from the electrically insulating layer, and at least one of the conductive circuits extends through at least one of the side wall of the first metal layer and the side wall of the second metal layer and is embedded in the electrically insulating layer.

12 Claims, 4 Drawing Sheets

HEAT-DISSIPATING SUBSTRATE STRUCTURE WITH BUILT-IN CONDUCTIVE CIRCUITS

FIELD OF THE DISCLOSURE

The present disclosure relates to a heat-dissipating substrate structure, and more particularly to a heat-dissipating substrate structure with built-in conductive circuits.

BACKGROUND OF THE DISCLOSURE

An electrical connection is formed by wire bonding after metal layers are formed in current heat-dissipating substrate structures. However, due to a need for an additional external wire bonding process, an inadequate bonding force of the wire bonding may cause problems and reduce reliability. In addition, an overall volume and occupied space are consequently increased.

SUMMARY OF THE DISCLOSURE

In response to the above-referenced technical inadequacies, the present disclosure provides a heat-dissipating substrate structure with built-in conductive circuits.

In one aspect, the present disclosure provides a heat-dissipating substrate structure with built-in conductive circuits, which includes an electrically insulating layer, a first metal layer, a second metal layer, and a heat-dissipating layer. The first metal layer and the second metal layer are disposed on the heat-dissipating layer at an interval. The electrically insulating layer encloses and is in contact with side walls of the first metal layer and side walls of the second metal layer, such that a top wall of the first metal layer and a top wall of the second metal layer are exposed from the electrically insulating layer, and at least one of the conductive circuits extends through at least one of the side wall of the first metal layer and the side wall of the second metal layer and is embedded in the electrically insulating layer.

In certain embodiments, one of the conductive circuits is connected between the side wall of the first metal layer and the side wall of the second metal layer, so that the side wall of the first metal layer is electrically connected to the side wall of the second metal layer, and the one of the conductive circuits is completely embedded in the electrically insulating layer.

In certain embodiments, the conductive circuits correspondingly extend from the side wall of the first metal layer and the side wall of the second metal layer and pass through the electrically insulating layer, so that the conductive circuits are partially embedded in the electrically insulating layer.

In certain embodiments, two of the conductive circuits respectively extend from two of the side walls of the first metal layer that are opposite to each other, and respectively bend upwards to form bending portions that pass through the electrically insulating layer, and remaining ones of the conductive circuits extend from the side wall of the second metal layer and respectively bend upwards to form the bending portions that pass through the electrically insulating layer.

In certain embodiments, the conductive circuit is made of a highly electrically conductive material, and the conductive circuit is at least one of a conductive wire, a conductive strip, and a conductive plate.

In certain embodiments, the first metal layer and the second metal layer are connected to the heat-dissipating layer, respectively, through a first thermally conductive and electrically insulating layer and a second thermally conductive and electrically insulating layer.

In certain embodiments, the first thermally conductive and electrically insulating layer and the second thermally conductive and electrically insulating layer are each made of a high-binding polymeric material, and the first thermally conductive and electrically insulating layer and the second thermally conductive and electrically insulating layer each include a ceramic filler.

In certain embodiments, the first metal layer and the second metal layer are each connected to the heat-dissipating layer by sintering.

In certain embodiments, the heat-dissipating substrate structure with built-in conductive circuits further includes a first heat-dissipating sub-layer and a second heat-dissipating sub-layer. The first heat-dissipating sub-layer and the second heat-dissipating sub-layer are respectively disposed on the first metal layer and the second metal layer.

In certain embodiments, the first heat-dissipating sub-layer is connected to the first metal layer through one thermally conductive and electrically insulating layer, and the second heat-dissipating sub-layer is connected to the second metal layer through another thermally conductive and electrically insulating layer.

In certain embodiments, the one thermally conductive and electrically insulating layer and the another thermally conductive and electrically insulating layer are each made of a high-binding polymeric material, and the one thermally conductive and electrically insulating layer and the another thermally conductive and electrically insulating layer each include a ceramic filler.

In certain embodiments, the first heat-dissipating sub-layer and the second heat-dissipating sub-layer are respectively connected to the first metal layer and the second metal layer by sintering.

Therefore, by virtue of "the electrically insulating layer enclosing and being in contact with side walls of the first metal layer and side walls of the second metal layer, such that the top wall of the first metal layer and the top wall of the second metal layer being exposed from the electrically insulating layer, and at least one of the conductive circuits extending through at least one of the side wall of the first metal layer and the side wall of the second metal layer and being embedded in the electrically insulating layer", the conduct circuits in the heat-dissipating substrate structure provided by the present disclosure extend from the side wall of the metal layer and are embedded in the electrically insulating layer, so that the need for an additional external wire bonding process and a reliability problem caused by a bonding force of wire bonding can be eliminated, thereby effectively improving the reliability thereof and reducing an overall volume and space occupied.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
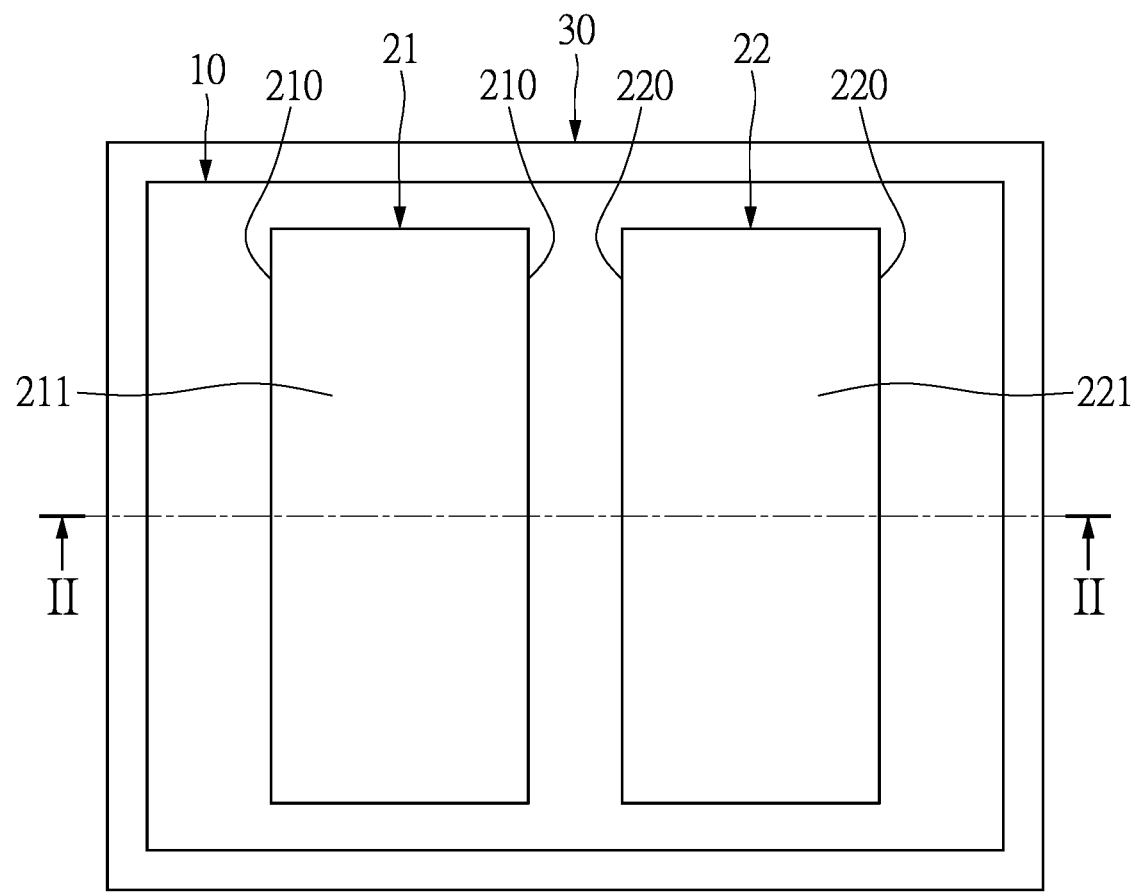
FIG. 1 is a schematic top view according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
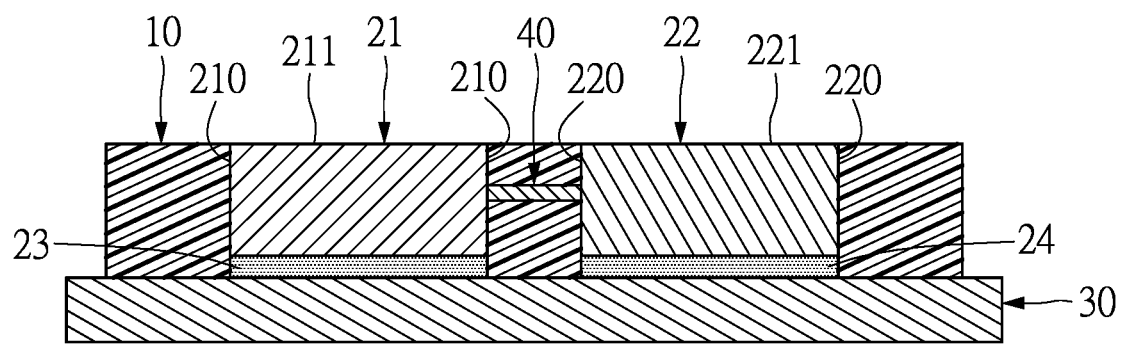
FIG. 2 is a schematic sectional view taken along line II-II of FIG. 1.

Referring to FIG. 1 and FIG. 2, a first embodiment of the present disclosure provides a heat-dissipating substrate structure with built-in conductive circuits. As shown in the figures, the heat-dissipating substrate structure with built-in conductive circuits according to the first embodiment of the present disclosure includes an electrically insulating layer 10, a first metal layer 21, a second metal layer 22, and a heat-dissipating layer 30.

The heat-dissipating layer 30 can be an aluminum heat sink, a heat sink with heat-dissipating fins, or a metal substrate with a heat sink effect, but it is not limited thereto.

The first metal layer 21 and the second metal layer 22 are disposed on the heat-dissipating layer 30 at an interval. In the present embodiment, a number of metal layers can be two, but the number of the metal layers is not limited and can be two or more. In another embodiment, the metal layer can be configured to be a predetermined pattern.

In the present embodiment, the first metal layer 21 and the second metal layer 22 are, in particular, connected to the heat-dissipating layer 30 respectively through a first thermally conductive and electrically insulating layer 23 and a second thermally conductive and electrically insulating layer 24. The first thermally conductive and electrically insulating layer 23 and the second thermally conductive and electrically insulating layer 24 can each be made of a high-binding polymeric material, such as an epoxy resin, to increase binding therebetween. In addition, the first thermally conductive and electrically insulating layer 23 and the second thermally conductive and electrically insulating layer 24 can each further include a ceramic filler to increase thermal conductivity. In another embodiment, the first thermally conductive and electrically insulating layer 23 and the second thermally conductive and electrically insulating layer 24 can also be a first sintered layer and a second sintered layer, respectively, such that the first metal layer 21 and the second metal layer 22 can be connected to the heat-dissipating layer 30 by sintering. That is to say, the first metal layer 21 and the second metal layer 22 can each be connected to the heat-dissipating layer 30 by sintering.

In the present embodiment, the electrically insulating layer 10 encloses side walls 210 of the first metal layer 21 in contact and side walls 220 of the second metal layer 22 in contact, so that a top wall 211 of the first metal layer 21 and a top wall 221 of the second metal layer 22 are exposed from the electrically insulating layer 10. The electrically insulating layer 10 can be made of a silicone material. The electrically insulating layer 10 can also be made of a resin. In addition, at least one conductive circuit 40 extends from at least one of the side wall 210 of the first metal layer 21 and the side wall 220 of the second metal layer 22 and is embedded in the electrically insulating layer 10. A number of the conductive circuit 40 is not limited, and the conductive circuit 40 can be made of a highly electrically conductive material. Moreover, the conductive circuit 40 can be a conductive wire, a conductive strip, or a conductive plate, and geometry thereof is not limited.

In the present embodiment, the conductive circuit 40 is connected between the side wall 210 of the first metal layer 21 and the side wall 220 of the second metal layer 22, so that the side wall 210 of the first metal layer 21 is electrically connected to the side wall 220 of the second metal layer 22, and the conductive circuit 40 is completely embedded in the electrically insulating layer 10.

Second Embodiment

Figure 3:
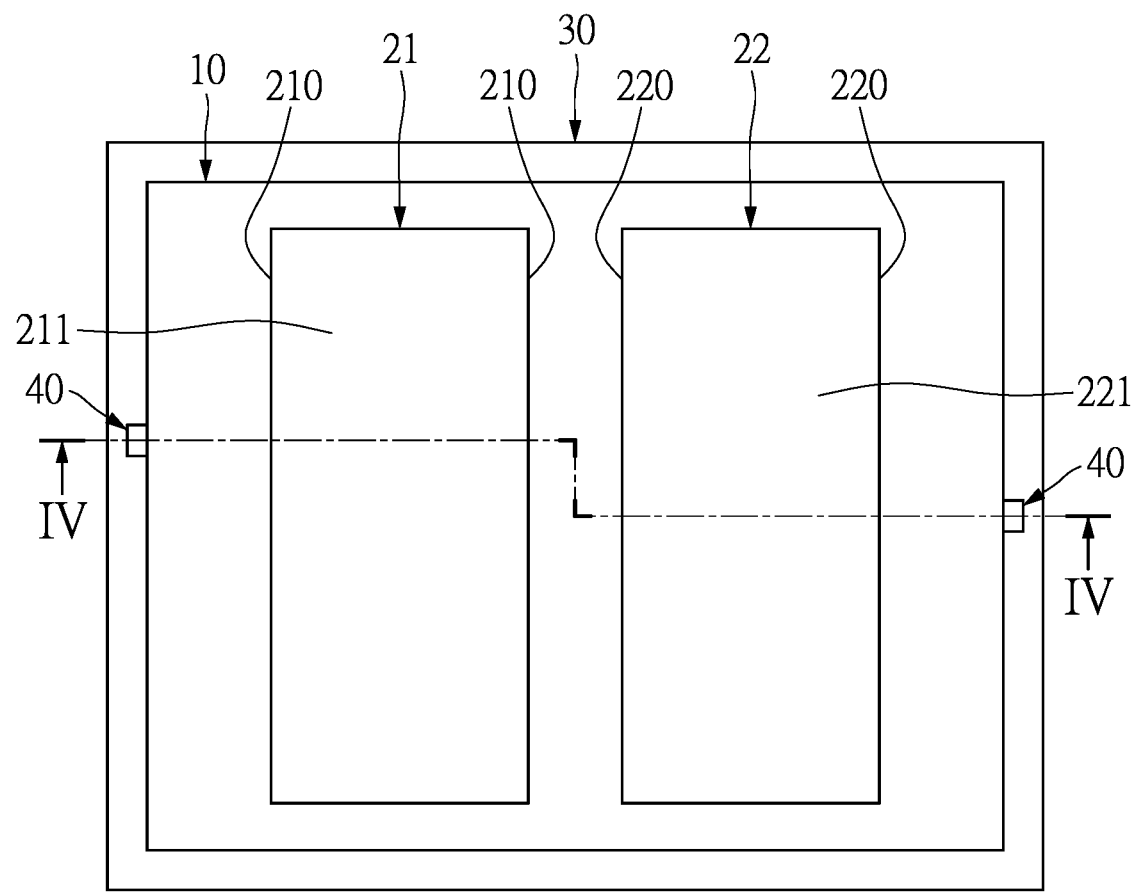
FIG. 3 is a schematic top view according to a second embodiment of the present disclosure.
Figure 4:
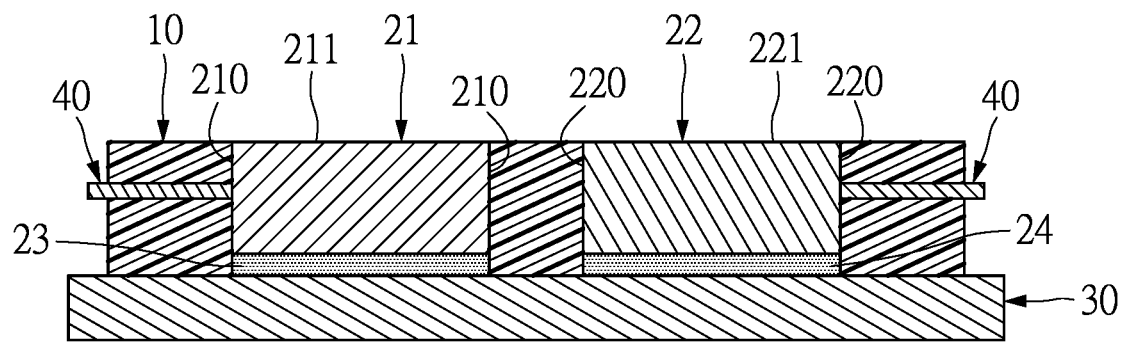
FIG. 4 is a schematic sectional view taken along line IV-IV of FIG. 3.

Referring to FIG. 3 and FIG. 4, a second embodiment of the present disclosure provides a heat-dissipating substrate structure with built-in conductive circuits. As shown in the figures, the heat-dissipating substrate structure with built-in conductive circuits according to the second embodiment of the present disclosure includes an electrically insulating layer 10, a first metal layer 21, a second metal layer 22, and a heat-dissipating layer 30.

In the present embodiment, two of the conductive circuits 40 correspondingly extend from the side wall 210 of the first metal layer 21 and the side wall 220 of the second metal layer 22, and pass through the electrically insulating layer 10, such that the two of the conductive circuits 40 are partially embedded in the electrically insulating layer 10 to form an electrical connection with external devices or components, such as other metal layers.

It should be noted that the above is a description of differences between the present embodiment and other embodiments, and the same thereof is not reiterated herein.

Third Embodiment

Figure 5:
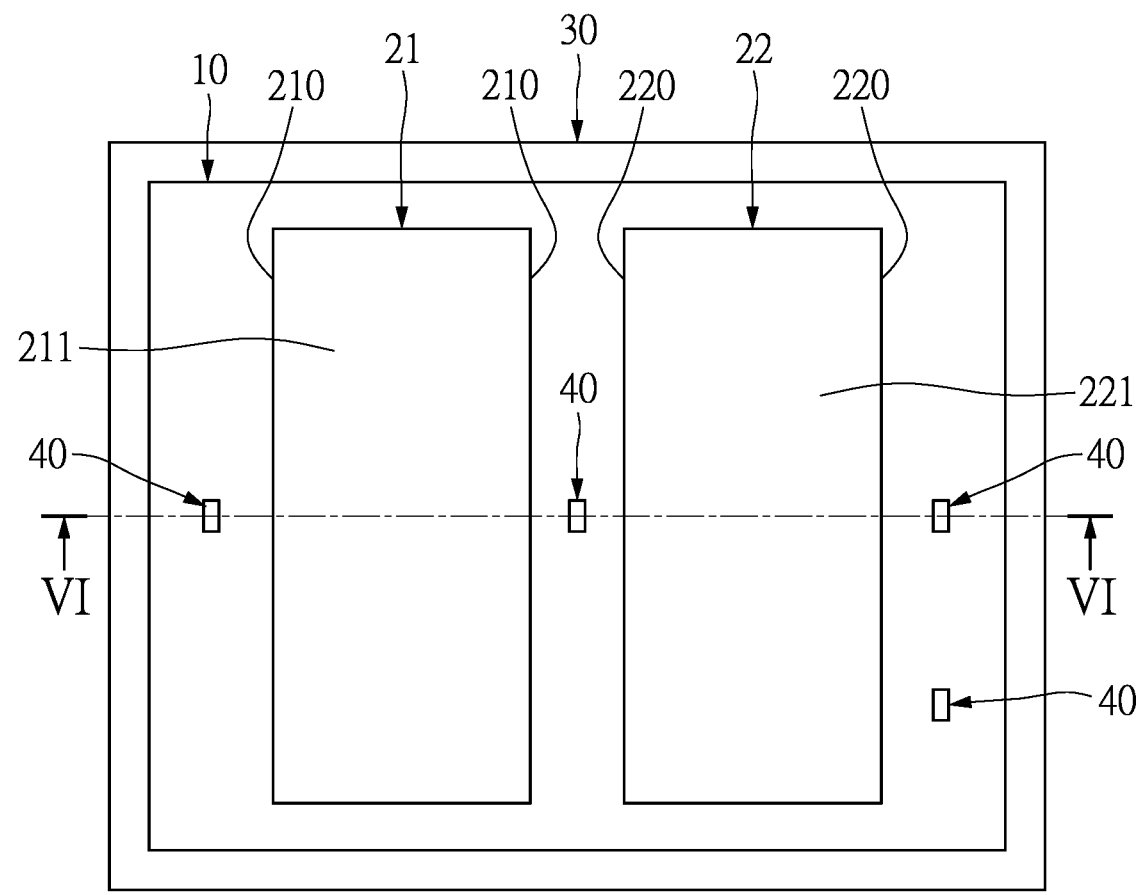
FIG. 5 is a schematic top view according to a third embodiment of the present disclosure.
Figure 6:
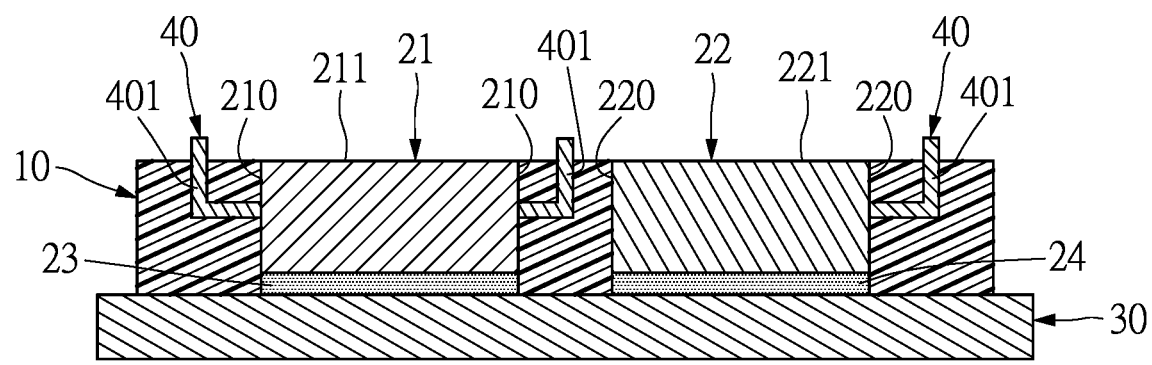
FIG. 6 is a schematic sectional view taken along line VI-VI of FIG. 5.

Referring to FIG. 5 and FIG. 6, a third embodiment of the present disclosure provides a heat-dissipating substrate structure with built-in conductive circuits. As shown in the figures, the heat-dissipating substrate structure with built-in conductive circuits according to the third embodiment of the present disclosure includes an electrically insulating layer 10, a first metal layer 21, a second metal layer 22, and a heat-dissipating layer 30.

In the present embodiment, two of a plurality of conductive circuits 40 respectively extend from two of side walls 210 of the first metal 21 that are opposite to each other, and bend upwards to form bending portions 401 that pass through the electrically insulating layer 10, and remaining ones of the plurality of the conductive circuits 40 extend from a side wall 220 of the second metal layer 22 and bend upwards to form the bending portions 401 that pass through the electrically insulating layer 10.

It should be noted that the above is a description of differences between the present embodiment and other embodiments, and the same thereof is not reiterated herein.

Fourth Embodiment

Figure 7:
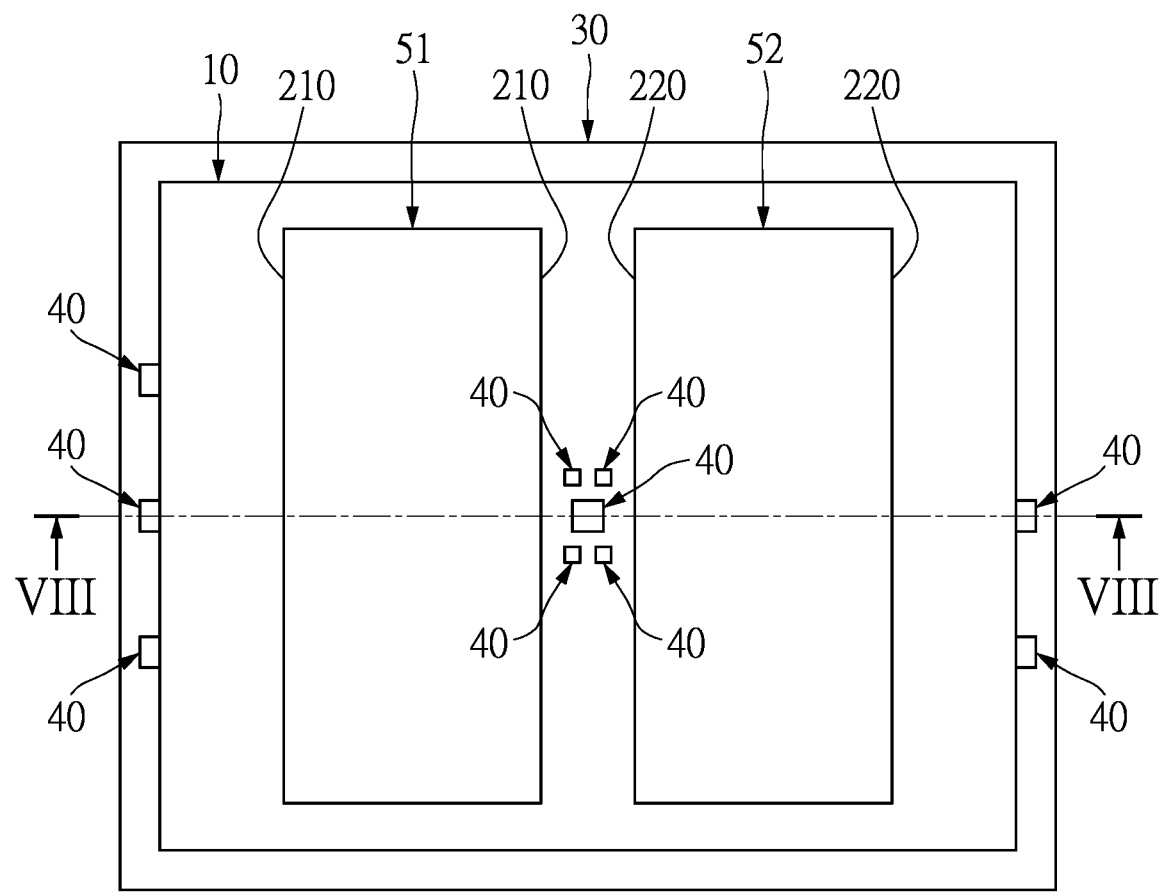
FIG. 7 is a schematic top view according to a fourth embodiment of the present disclosure.
Figure 8:
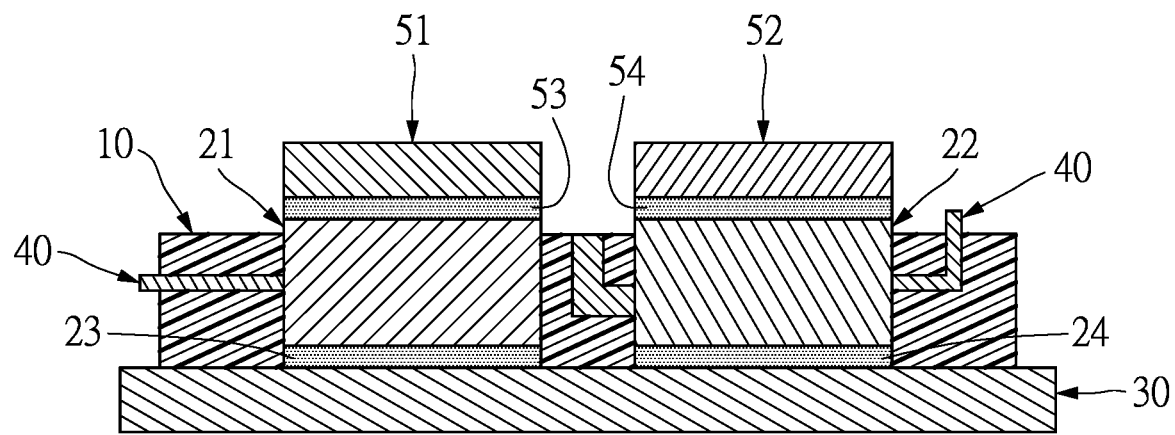
FIG. 8 is a schematic sectional view taken along line VIII-VIII of FIG. 7.

Referring to FIG. 7 and FIG. 8, a fourth embodiment of the present disclosure provides a heat-dissipating substrate structure with built-in conductive circuits. As shown in the figures, the heat-dissipating substrate structure with built-in conductive circuits according to the fourth embodiment of the present disclosure includes an electrically insulating layer 10, a first metal layer 21, a second metal layer 22, a heat-dissipating layer 30, a first heat-dissipating sub-layer 51, and a second heat-dissipating sub-layer 52.

In the present embodiment, the first heat-dissipating sub-layer 51 and the second heat-dissipating sub-layer 52 are disposed on the first metal layer 21 and the second metal layer 22, respectively. The first heat-dissipating sub-layer 51 and the second heat-dissipating sub-layer 52 can each be an aluminum heat sink or a metal heat-dissipating plate with a heat-dissipating effect, but it is not limited thereto.

In the present embodiment, the first heat-dissipating sub-layer 51 is connected to the first metal layer 21 through one thermally conductive and electrically insulating layer (a third thermally conductive and electrically insulating layer 53), and the second heat-dissipating sub-layer 52 is connected to the second metal layer 22 through another thermally conductive and electrically insulating layer (a fourth thermally conductive and electrically insulating layer 54). The third thermally conductive and electrically insulating layer 53 and the fourth thermally conductive and electrically insulating layer 54 can each be made of a high-binding polymeric material. Moreover, the third thermally conductive and electrically insulating layer 53 and the fourth thermally conductive and electrically insulating layer 54 each can also include a ceramic filler. In another embodiment, the third thermally conductive and electrically insulating layer 53 and the fourth thermally conductive and electrically insulating layer 54 each can also be a sintered layer. That is to say, the first heat-dissipating sub-layer 51 and the second heat-dissipating sub-layer 52 can respectively be connected to the first metal layer 21 and the second metal layer 22 by sintering.

Accordingly, the heat-dissipating substrate structure in the present embodiment further has a plurality of heat-dissipating sub-layers disposed on a plurality of metal layers, such that an overall heat-dissipating effect of the heat-dissipating substrate structure can be significantly increased.

It should be noted that the above is a description of differences between the present embodiment and other embodiments, and the same thereof is not reiterated herein.

Beneficial Effects of the Embodiments

In conclusion, by virtue of "the electrically insulating layer 10 enclosing and being in contact with side walls 210 of the first metal layer 21 and side walls 220 of the second metal layer 22, such that the top wall 211 of the first metal layer 21 and the top wall 221 of the second metal layer 22 being exposed from the electrically insulating layer 10, and at least one of the conductive circuits 40 extending through at least one of the side wall 210 of the first metal layer 21 and the side wall 220 of the second metal layer 22 and being embedded in the electrically insulating layer 10", the conduct circuits in the heat-dissipating substrate structure provided by the present disclosure extend from the side wall of the metal layer and are embedded in the electrically insulating layer, so that the need of an additional external wire bonding process and a reliability problem caused by a bonding force of wire bonding can be eliminated, thereby effectively improving the reliability thereof and reducing an overall volume and space occupied.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A heat-dissipating substrate structure with built-in conductive circuits, comprising: an electrically insulating layer, a first metal layer, a second metal layer, and a heat-dissipating layer, wherein the first metal layer and the second metal layer are disposed on the heat-dissipating layer at an interval, the electrically insulating layer encloses and is in contact with side walls of the first metal layer and side walls of the second metal layer, such that a top wall of the first metal layer and a top wall of the second metal layer are exposed from the electrically insulating layer, and at least one of the conductive circuits extends through at least one of the side wall of the first metal layer and the side wall of the second metal layer and is embedded in the electrically insulating layer.

2. The heat-dissipating substrate structure according to claim 1, wherein the conductive circuit is connected between the side wall of the first metal layer and the side wall of the second metal layer, so that the side wall of the first metal layer is electrically connected to the side wall of the second metal layer, and the conductive circuit is completely embedded in the electrically insulating layer.

3. The heat-dissipating substrate structure according to claim 1, wherein the conductive circuits correspondingly extend from the side wall of the first metal layer and the side wall of the second metal layer and pass through the electrically insulating layer, so that the conductive circuits are partially embedded in the electrically insulating layer.

4. The heat-dissipating substrate structure according to claim 1, wherein two of the conductive circuits respectively extend from two of the side walls of the first metal layer that are opposite to each other, and respectively bend upwards to form bending portions that pass through the electrically insulating layer, and wherein remaining ones of the conductive circuits extend from the side wall of the second metal layer and respectively bend upwards to form the bending portions that pass through the electrically insulating layer.

5. The heat-dissipating substrate structure according to claim 1, wherein the conductive circuit is made of a highly electrically conductive material, and the conductive circuit is at least one of a conductive wire, a conductive strip, and a conductive plate.

6. The heat-dissipating substrate structure according to claim 1, wherein the first metal layer and the second metal layer are connected to the heat-dissipating layer, respectively, through a first thermally conductive and electrically insulating layer and a second thermally conductive and electrically insulating layer.

7. The heat-dissipating substrate structure according to claim 6, wherein the first thermally conductive and electrically insulating layer and the second thermally conductive and electrically insulating layer are each made of a high-binding polymeric material, and the first thermally conductive and electrically insulating layer and the second thermally conductive and electrically insulating layer each include a ceramic filler.

8. The heat-dissipating substrate structure according to claim 1, wherein the first metal layer and the second metal layer are each connected to the heat-dissipating layer by sintering.

9. The heat-dissipating substrate structure according to claim 1, further comprising: a first heat-dissipating sub-layer and a second heat-dissipating sub-layer, the first heat-dissipating sub-layer and the second heat-dissipating sub-layer being respectively disposed on the first metal layer and the second metal layer.

10. The heat-dissipating substrate structure according to claim 9, wherein the first heat-dissipating sub-layer is connected to the first metal layer through one thermally conductive and electrically insulating layer, and the second heat-dissipating sub-layer is connected to the second metal layer through another thermally conductive and electrically insulating layer.

11. The heat-dissipating substrate structure according to claim 10, wherein the one thermally conductive and electrically insulating layer and the another thermally conductive and electrically insulating layer are each made of a high-binding polymeric material, and the one thermally conductive and electrically insulating layer and the another thermally conductive and electrically insulating layer each include a ceramic filler.

12. The heat-dissipating substrate structure according to claim 9, wherein the first heat-dissipating sub-layer and the second heat-dissipating sub-layer are respectively connected to the first metal layer and the second metal layer by sintering.

* * * * *